US008138569B2

(12) United States Patent
Veliadis et al.

(10) Patent No.: US 8,138,569 B2
(45) Date of Patent: Mar. 20, 2012

(54) GUARD RING STRUCTURES AND METHOD OF FABRICATING THEREOF

(75) Inventors: John Victor D. Veliadis, Hanover, MD (US); Megan J. Snook, Columbia, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 12/900,294

(22) Filed: Oct. 7, 2010

(65) Prior Publication Data

US 2011/0049666 A1 Mar. 3, 2011

Related U.S. Application Data

(62) Division of application No. 12/285,139, filed on Sep. 30, 2008, now Pat. No. 7,825,487.

(51) Int. Cl.
  *H01L 23/58* (2006.01)
(52) U.S. Cl. ......................... 257/491; 257/487
(58) Field of Classification Search .................. 257/491, 257/134, 256, 409, 623; 438/179, 259
  See application file for complete search history.

(56) References Cited

U.S. PATENT DOCUMENTS

| 6,037,632 | A | * | 3/2000 | Omura et al. | 257/341 |
| 2002/0063300 | A1 | | 5/2002 | Miyajima | |
| 2003/0160302 | A1 | | 8/2003 | Sankin et al. | |
| 2003/0162355 | A1 | | 8/2003 | Sankin et al. | |
| 2005/0202637 | A1 | | 9/2005 | Chiola | |
| 2005/0258454 | A1 | * | 11/2005 | Kumar et al. | 257/211 |
| 2007/0096145 | A1 | * | 5/2007 | Watanabe | 257/134 |
| 2007/0096172 | A1 | * | 5/2007 | Tihanyi et al. | 257/288 |

OTHER PUBLICATIONS

Inter. Search Report, Apr. 21, 2010, Northrop Grumman Systems.

* cited by examiner

*Primary Examiner* — Victor A Mandala
*Assistant Examiner* — Errol Fernandes
(74) *Attorney, Agent, or Firm* — Andrews Kurth LLP (57) ABSTRACT

A guard ring structure for use in a semiconductor device. The guard ring structure includes a semiconductor layer stack having a first layer and a second layer on top of the first layer, gates structures formed in the first layer; and guard rings formed in the first layer. The second layer has a dopant concentration that is higher than the dopant concentration of the first layer. The gates and the guard rings are formed simultaneously using a single mask.

9 Claims, 8 Drawing Sheets

FIG. 15

GUARD RING STRUCTURES AND METHOD OF FABRICATING THEREOF

RELATED APPLICATION

This Application is a Divisional Application of U.S. patent application Ser. No. 12/285,139, filed on Sep. 30, 2010.

TECHNICAL FIELD

The invention relates generally to semiconductors, and more particularly, to a method of fabricating semiconductor devices with a trenched guard ring structure.

BACKGROUND

The field-effect transistor (FET) is a type of transistor that relies on an electric field to control the shape and hence the conductivity of a 'channel' in a semiconductor material. In junction field effect transistors (JFETs), the conductivity of the channel is controlled by the application of a voltage to a p-n junction. JFETs may be constructed as p-channel or n-channel and may be operated as enhancement mode devices or depletion mode devices. Similar to the JFET is the metal semiconductor field effect transistor (MESFET). The MESFET is quite similar to a JFET in construction and terminology. The difference is that instead of using a p-n junction for a gate, a Schottky metal-semiconductor junction is used in MESFETs.

JFETs and MESFETs are widely used electronic devices. For optimum device performance, it is important to obtain a device breakdown voltage as close as possible to the intrinsic capability of the underlying semiconductor material. However, the breakdown voltage of practical devices is reduced by the occurrence of high electric fields at the edges of the device. In particular, electric field crowding at the edges of the device leads to premature voltage breakdown. To minimize premature voltage breakdown, specialized edge termination structures must be implemented in order to obtain maximum breakdown voltage with relatively low associated on-state resistance. The multiple floating guard ring (MFGR) edge termination structure is used to alter the charge distribution and electric field at surfaces and material interfaces of semiconductor devices. The interface between the guard ring and the substrate in which it is embedded forms a depletion region that enhances resistance to voltage breakdown in an applied field. The MFGR also provides a cost-effective method of edge termination because it may use fewer fabrication steps than the Junction Termination Extension technique, another technique for edge termination. The MFGR, however, is very sensitive to surface charges in the dielectric-semiconductor interface. Positive charge at the dielectric-semiconductor interface may reduce the effectiveness of the floating guard rings and result in a reduction of blocking voltage for the devices. In addition, the charges near the dielectric-semiconductor interface, mostly positive, can move towards or away from the dielectric-semiconductor interface, causing time dependent breakdown voltage, or breakdown walk-out.

SUMMARY

A method for fabricating guard rings in a semiconductor device is disclosed. The method includes forming a mesa on a semiconductor layer stack having two or more layers of semiconductor materials, forming trenches for gates on the mesa and trenches for guard rings on the periphery of the mesa simultaneously in a single etching step, and forming self-aligned gates and guard rings in the trenches. The bottom surfaces of the gates have a higher elevation than the bottom surfaces of the guard rings.

Also disclosed is a guard ring structure for use in a semiconductor device. The guard ring structure includes a semiconductor layer stack having a first layer and a second layer on top of the first layer, gates formed in the first layer, and guard rings formed in the first layer. The second layer has a dopant concentration that is higher than a dopant concentration of the first layer. The gates and the guard rings are formed simultaneously using a single mask.

Also disclosed is a guard ring structure that includes a semiconductor layer stack having a first layer, a second layer on top of the first layer and a third layer on top of the second layer, gates formed in the second layer, and guard rings formed in the first layer. The second layer has a dopant concentration that is higher than a dopant concentration of the first layer. The third layer has a dopant concentration that is higher than the dopant concentration of the second layer. The gates and the guard rings are formed simultaneously using a single mask.

Also disclosed is a guard ring structure that includes a semiconductor layer stack having a first layer, a second layer on top of the first layer and a third layer on top of the second layer, and gates and guard rings formed in the second layer. The second layer has a dopant concentration that is higher than a dopant concentration of the first layer. The third layer has a dopant concentration that is higher than the dopant concentration of the second layer. The gates and the guard rings are formed simultaneously using a single mask.

Also disclosed is a guard ring structure that includes a semiconductor layer stack having a first layer, a second layer on top of the first layer and a third layer on top of the second layer, gates formed in the second layer, and guard rings formed partially in the second layer and partially in the first layer. The second layer has a dopant concentration that is higher than a dopant concentration of the first layer. The third layer has a dopant concentration that is higher than the dopant concentration of the second layer. The gates and the guard rings are formed simultaneously using a single mask.

DETAILED DESCRIPTION OF DRAWINGS

The detailed description will refer to the following drawings, wherein like numerals refer to like elements, and wherein.

DETAILED DESCRIPTION

This description is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "front," "back," "up," "down," "top" and "bottom," as well as derivatives thereof, should be construed to refer to the orientation as then described or as shown in the drawing figure under discussion. These relative terms are for convenience of description and normally are not intended to require a particular orientation. Terms concerning attachments, coupling and the like, such as "connected" and "attached," refer to a relationship wherein structures are secured or attached to one another either directly or indirectly through intervening structures, as well as both movable or rigid attachments or relationships, unless expressly described otherwise.

In describing various embodiments, specific terminology is employed for the sake of clarity. However, the invention is not intended to be limited to the specific terminology so selected. It is to be understood that each specific element includes all technical equivalents which operate in a similar manner to accomplish a similar purpose.

Figure 1:
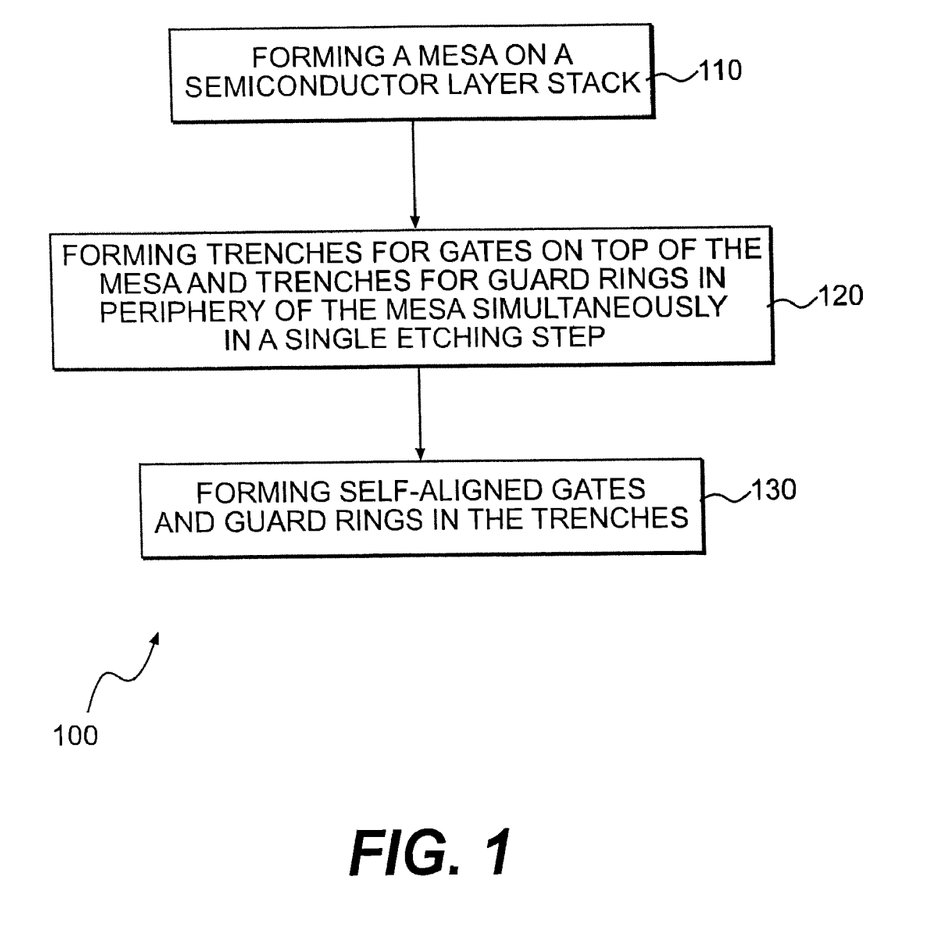
FIG. 1 is a flow chart showing a method for fabricating a guard ring structure.

FIG. 1 shows an embodiment of a method 100 for fabricating a trenched, self-aligned guard ring structure. The method 100 includes: forming (110) a mesa on a semiconductor layer stack having two or more layers of semiconductor material, forming (120) trenches for gates on top of said mesa and trenches for guard rings in periphery of said mesa simultaneously in a single etching step, and forming (130) self-aligned gates and guard rings in the trenches, wherein the bottom surfaces of gates have a higher elevation than the bottom surfaces of guard rings.

The semiconductor layer stack can be any material suitable for the fabrication of semiconductor devices. Examples of suitable semiconductor material include, but are not limited to, SiC, GaAs, group III metal nitride such as GaN, $Al_xGa_{1-x}N$/GaN, and $In_xGa_{1-x}N$/GaN, Si and diamond, wherein $0<x<1$. In one embodiment, at least one of the two or more layers of semiconductor material is doped with a n-type or p-type dopant.

Examples of the semiconductor devices include, but are not limited to, field-effect transistors (FET), diodes, Junction field effect transistors (JFETs), vertical junction field-effect transistors (VJFETs), ion-implanted-static-induction-transistor (SITs), metal semiconductor field effect transistors (MESFETs), metal-oxide-semiconductor field-effect transistors (MOSFETs), bipolar junction transistors (BJTs), insulated-gate bipolar transistors (IGBTs), rectifiers, and any vertical semiconductor device that blocks voltage.

Figure 2:
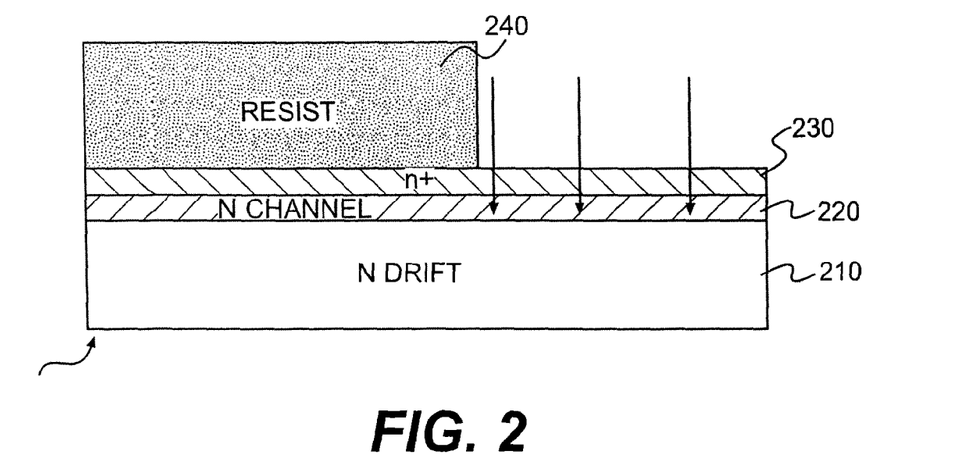
FIG. 2 is a schematic of an embodiment of a resist patterned substrate.
Figure 3:
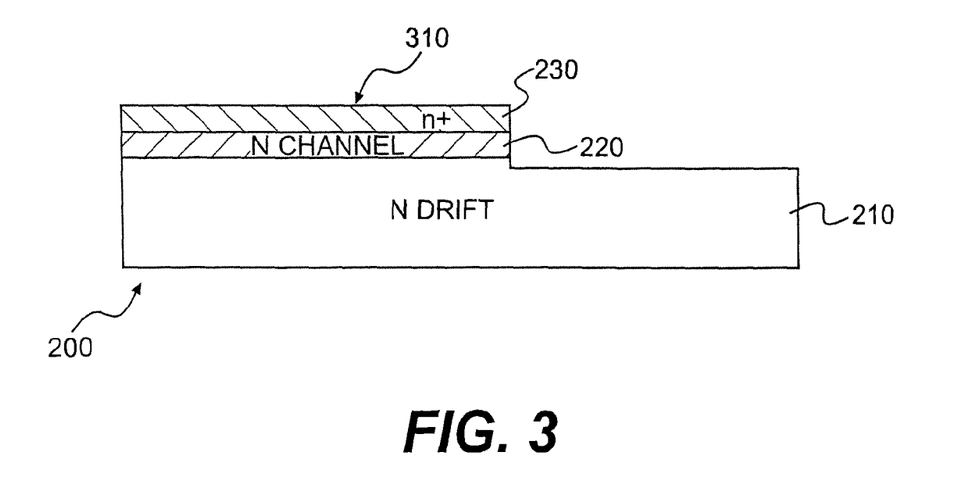
FIG. 3 is a schematic of an embodiment of a mesa structure.

An embodiment of forming (110) a mesa is illustrated in FIGS. 2 and 3. In this embodiment, the semiconductor layer stack 200 contains a lightly doped N drift layer 210, a mildly doped N channel layer 220 on top of the N drift layer 210, and a heavily doped n+ layer 230 on top of the N channel layer 220. Typically, the lightly doped N drift layer 210 has a dopant concentration of $10^{14}$-$10^{16}$ atoms/cm$^3$, the mildly doped N channel layer 220 has a dopant concentration of $10^{15}$-$10^{18}$ atoms/cm$^3$, and the heavily doped n+ layer 230 has dopant concentration in excess of $10^{18}$ atoms/cm$^3$. In another embodiment, the semiconductor layer stack contains only two layers, a lower layer and an upper layer having a dopant concentration that is higher than the dopant concentration in the lower layer. In one embodiment, the lower layer has a dopant concentration of $10^{14}$-$10^{18}$ atoms/cm$^3$ and the upper layer has a dopant concentration in excess of $10^{18}$ atoms/cm$^3$.

The semiconductor layer stack 200 is attached to a substrate that may include a top buffer layer. The substrate may be any material upon which a semiconductor layer can be deposited. Examples of suitable substrate material include, but are not limited to, SiC, GaAs, group III metal nitrides such as GaN, $Al_xGaN_{1-x}$/GaN, and $In_xGa_{1-x}N$/GaN, Si, sapphire, and diamond, wherein $0<x<1$. In one embodiment, the substrate includes a top buffer layer that is in direct contact with the semiconductor layer stack 200 and separates the semiconductor layer stack 200 from the rest of the substrate. The top buffer layer can be a semiconductor layer such as SiC, GaAs, group III metal nitride such as GaN, $Al_xGaN_{1-x}$/GaN, and $In_xGa_{1-x}$/GaN, Si, and diamond, wherein $0<x<1$.

Referring again to FIG. 2, the semiconductor layer stack 200 is coated with a resist which is then exposed and developed to create a resist mask 240. As shown in FIG. 3, a mesa structure 310 is created by etching the masked semiconductor layer stack 200 of FIG. 2 and then removing the resist mask 240. This approach allows for etching with a narrow angle (i.e., a close-to-vertical etch). In the embodiment shown in FIG. 3, the mesa 310 is created by etching through the n+ layer 230, the N-channel layer 220, and into the N drift layer 210 in areas surrounding the mesa 310, i.e., by removing the n+ layer 230, the N channel layer 220, and a portion of the N drift layer 210 in areas surrounding the mesa 310. In another embodiment, the mesa 310 is created by etching through the n+ layer 230 and the N-channel layer 220, and stopping at the interface of the N-channel layer 220 and the N drift layer 210, i.e., by removing the n+ layer 230 and the N channel layer 220, but not the N drift layer 210 in areas surrounding the mesa 310. In another embodiment, the mesa 310 is created by etching through the n+ layer 230, and into the N-channel layer 220, i.e., by removing the n+ layer 230 and a portion of the N channel layer 220 in areas surrounding the mesa 310.

A person of ordinary skill in the art would understand that the mesa structure 310 can be created using many other methods known in the art. For example, instead of a resist mask, a dielectric mask or a metal mask or a combination of those may be formed and used to create the mesa structure 310.

Figure 4:
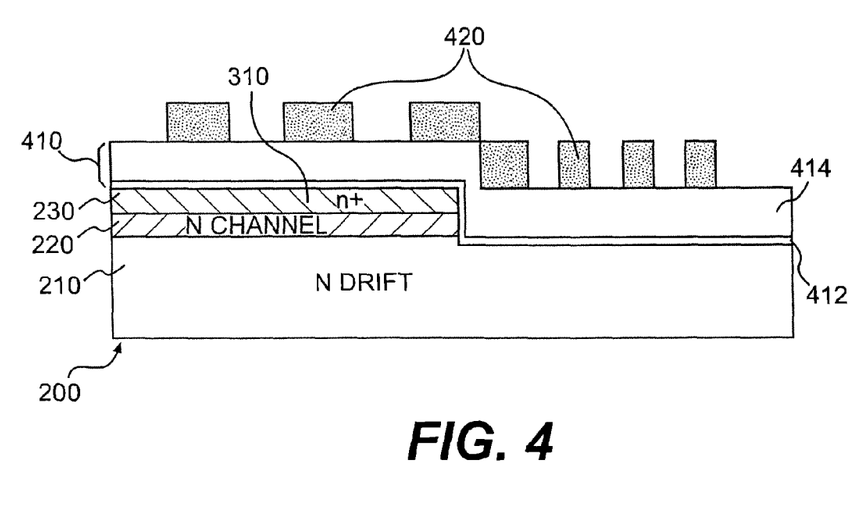
FIG. 4 is a schematic of an embodiment of a resist patterned mesa structure.
Figure 5:
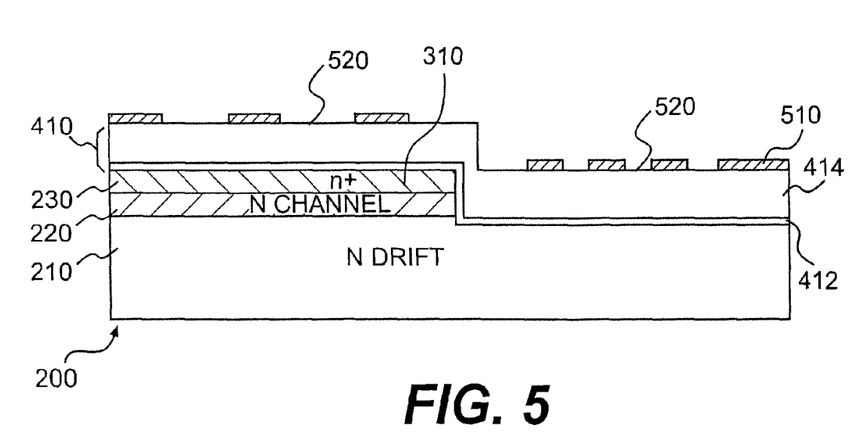
FIG. 5 is a schematic of an embodiment of a mesa structure with a metal mask.
Figure 6:
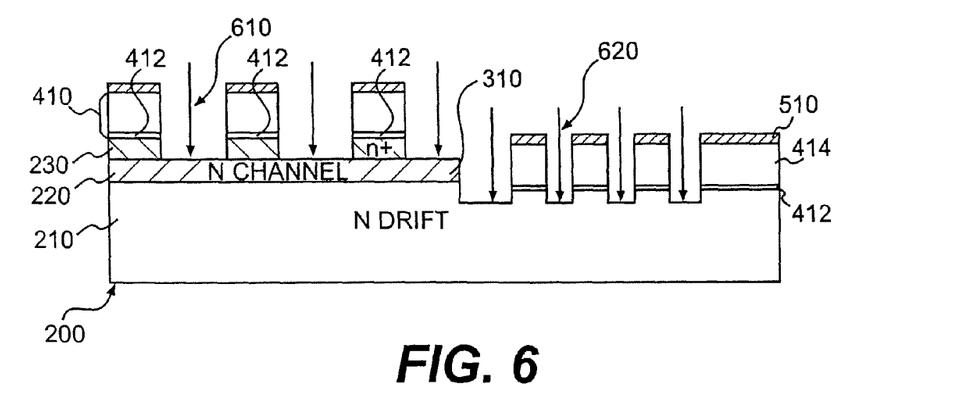
FIG. 6 is a schematic of an embodiment of a mesa structure with trenches for gates and guard rings.

FIGS. 4-6 illustrate an embodiment of forming (120) trenches. Referring now to FIG. 4, the mesa structure 310 is coated with a dielectric layer 410. The dielectric layer 410 may be thermally grown or deposited using a deposition technique well known in the art, such as chemical vapor deposition (CVD), physical vapor deposition (PVD) or sputtering. In one embodiment, the dielectric layer 410 is formed by thermally growing a thin oxide layer 412 on the surface of the mesa structure 310 to ensure good adhesion, and then depositing a thicker dielectric layer 414 on top of the oxide layer 412. In another embodiment, the dielectric layer contains tetraethyl orthosilicate (TEOS). The dielectric layer 410 is coated and patterned with a resist 420.

Referring now to FIG. 5, a metal layer 510 is sputtered, evaporated or blanket deposited on the patterned resist 420.

The patterned resist 420 is removed, lifting off the metal layer 510 that is on the patterned resist 420, therefore leaving exposed areas 520 on the oxide layer 410.

In the embodiment shown in FIG. 6, an etch is performed to create trenches 610 on top of the mesa 310 for gate structures, and trenches 620 in the periphery of the mesa 310 for guard rings. The etching process is stopped when the trenches 610 reach into N channel layer 220. In one embodiment, the trenches 620, which start at the N drift layer 210, are now formed entirely into the N drift layer 210. The simultaneous etching of the trenches 610 and 620 with the same metal mask allows for the precise alignment of trenches 610 and 620.

In another embodiment, the mesa 310 is formed by etching the semiconductor layer stack 200 to the N channel layer 220. The trenches 620, which now start at the N channel layer 220, are formed entirely in the N channel layer 220.

In yet another embodiment, the mesa 310 is formed by etching the semiconductor layer stack 200 to the N channel layer 220. The trenches 620, which start at the N channel layer 220, are formed by etching through the N channel layer 220 and extending into the N drift layer 210.

A person of ordinary skill in the art would understand that the forming step 120 may be performed using many other methods known in the art. For example, an etch may be performed directly on the resist 420 without the use of a metal mask to form trenches on the layer stack 200.

Figure 7:
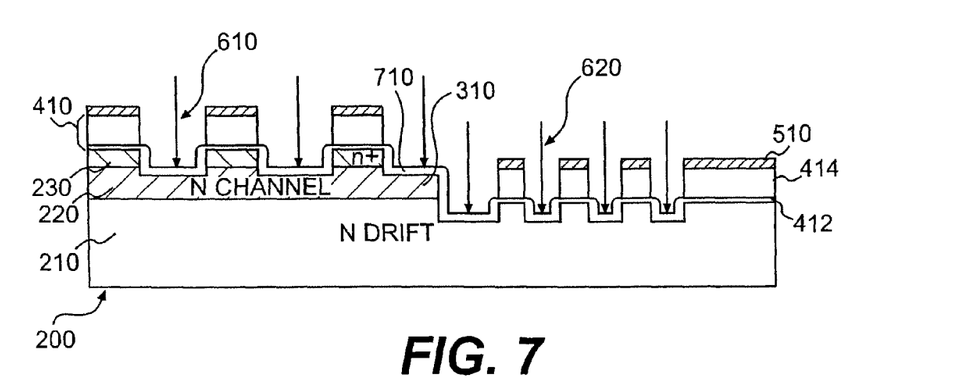
FIG. 7 is a schematic of an embodiment of a trenched mesa structure with an oxide coating.
Figure 8:
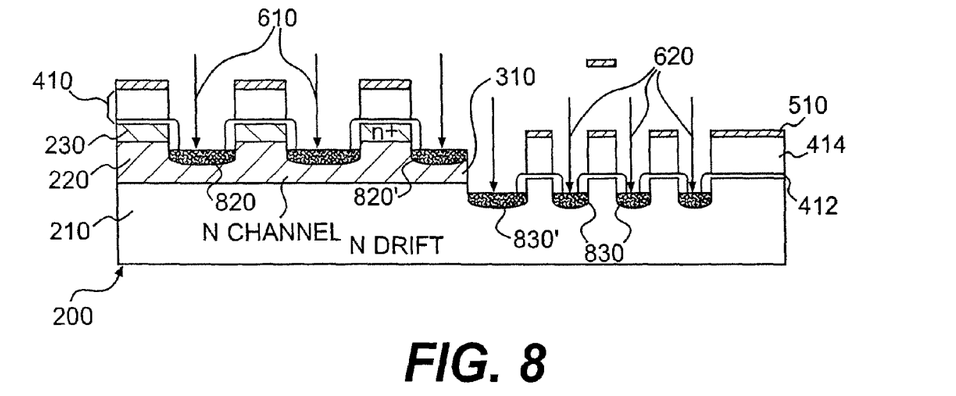
FIG. 8 is a schematic of an embodiment of a mesa structure with gates and guard rings.

FIGS. 7-8 illustrate an embodiment of forming (130) self-aligned gates and guard rings. Referring now to FIG. 7, a thermally grown oxide or deposited dielectric layer 710 is optionally formed in trenches 610 and 620. The oxide layer 710 is etched away at the bottom of trenches 610 and 620 to expose the N channel layer 220 and N drift layer 210, respectively. A p-type material, such as boron, aluminum, or a combination thereof, is then implanted into the trenches 610 and 620 by ion implantation to form gates 820 and 820' and guard rings 830 and 830'. The optional dielectric layer 710 isolates the implanted p-type material from exposed area of the trenches 610 and 620. By using one mask level to simultaneously define the gates 820 and 820' and guard rings 830 and 830', the gates 820 and 820' are self-aligned to the guard rings 830 and 830'. The self-aligned fabrication process ensures that correct spacing between the main junction and the first guard ring, as well as the floating guard ring widths and spacings, are not affected by alignment tolerances, variations in wafer curvature, and other factors known to those skilled in the art to cause the problems observed in non self-aligned lithography processes. As a result, the separation between the outermost gate 820' and the innermost guard ring 830' (an important parameter in maximizing breakdown voltage), as well as the separation between the floating guard rings, is always perfect. The trenched formation of self-aligned gates 820, 820' and guard rings 830, 830' achieved in performing steps 120 and 130 eliminates the possibility of voltage breakdown performance deterioration due to broken rings, which was a common occurrence in the prior art resist/dielectric multiple floating guard ring formation methods. Moreover, processing steps are eliminated by fabricating self-aligned floating guard rings using this method.

In this embodiment, the outermost gate 820' and the innermost guard ring 830' are spaced to have overlapping depletion regions under operation. In reality, the etching step 120 will not provide perfectly vertical mesa 310 sidewall surfaces, and there will be a narrow-angled surface between the outermost gate 820' and the innermost guard ring 830'. This surface will be covered with the ion implantation that joins the outermost gate 820' to the innermost guard ring 830'.

Figure 9:
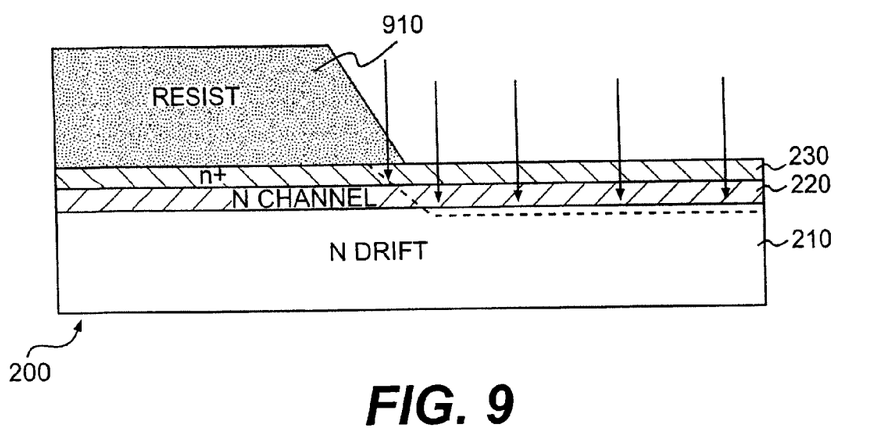
FIG. 9 is a schematic of an embodiment of a substrate with sloped resist.
Figure 10:
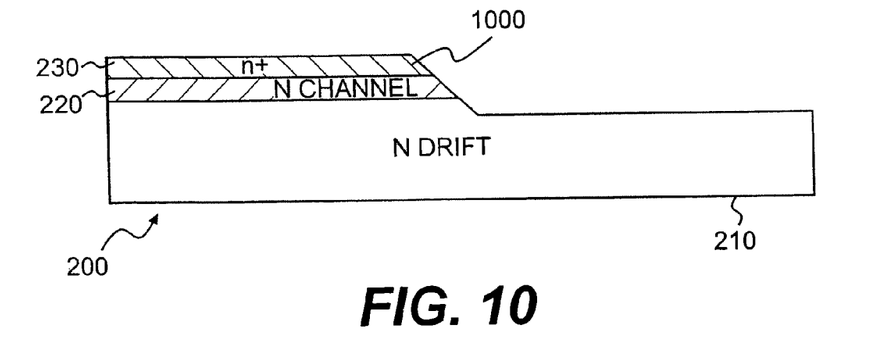
FIG. 10 is a schematic of an embodiment of a sloped mesa structure.

Alternatively, a wide-angled mesa structure may be formed in step 110 using standard "slope etching' techniques, which for example can include forming a thermally reflowed resist mask 910 (FIG. 9) or a sloped dielectric mask and etching into the N drift layer 210 (FIG. 10). In the embodiment shown in FIG. 10, the mesa 1000 is created by etching through the n+ layer 230, the N channel layer 220, and into the N drift layer 210 in peripheral areas of the layer stack 200, i.e., by removing the n+ layer 230, the N channel layer 220 in areas surrounding the mesa 1000. In another embodiment, the mesa 1000 is created by etching through the n+ layer 230 and the N-channel layer 220, and stopping at the interface of the N channel layer 220 and the N drift layer 210, i.e., by removing the n+ layer 230 and the N channel layer 220, but not the N drift layer 210 in areas surrounding the mesa 1000. In another embodiment, the mesa 1000 is created by etching through the n+ layer 230, and into the N channel layer 220, i.e., by removing the n+ layer 230 and a portion of the N channel layer 220 in areas surrounding the mesa 1000.

The layer stack 200 is then vertically etched for the formation of gate and guard ring trenches and p-type material is implanted as described above.

Figure 11:
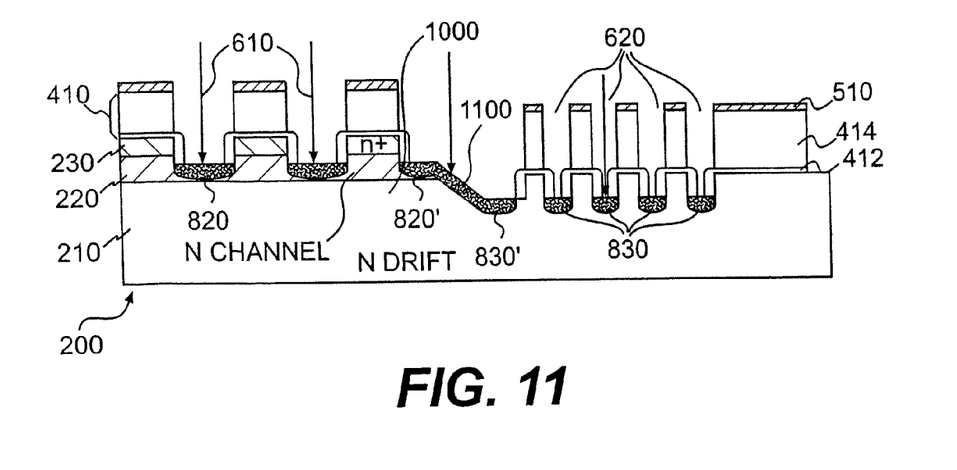
FIG. 11 is a schematic of an embodiment of a guard ring structure produced from the sloped mesa of FIG. 10.

As shown in FIG. 11, the outermost gate 820' and the innermost guard ring 830' are now joined with a sloped sidewall 1100 formed by ion implantation for superior gate-to-drain breakdown voltage capabilities. In one embodiment, the first guard ring 830' (i.e., the innermost guard ring) has a width that is larger than other guard rings 830.

Figure 12:
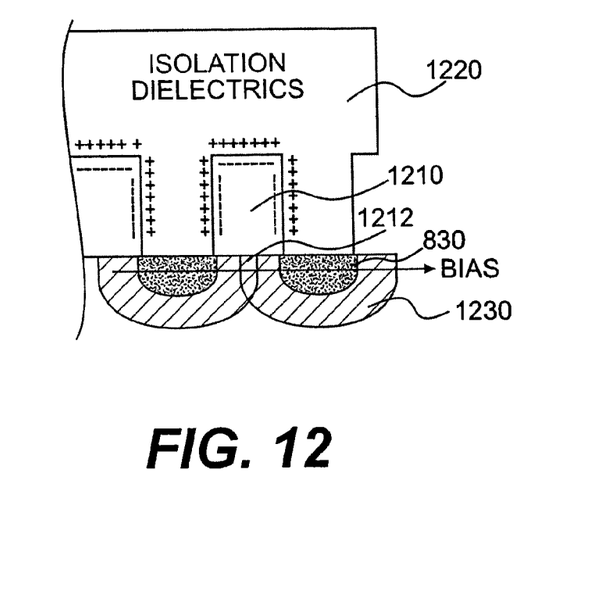
FIG. 12 is a schematic of charge distribution at the guard ring/dielectric interface.

In the final product, the guard rings 830, 830' are protected by a layer of insulating dielectrics. As shown in FIG. 12, the trenched guard ring design makes the guard ring structure 830 insensitive to dielectric surface charges accumulated at the semiconductor/dielectrics interface, because the charges accumulate on the surfaces of the semiconductor columns 1210 which have direct contact with the dielectric 1220. The horizontal area 1212 between the implanted guard rings 830 is not in direct contact with the accumulated surface charges. Therefore, the depletion regions 1230 expand with no charge interference and maximum breakdown voltage and reliability are achieved.

A person of ordinary skill in the art would understand that the number of the gates and the number of guard rings are not limited to the numbers shown in the figures, and are subjected to optimization for each specific application. In one embodiment, the gates are surrounded by 2 to 30 guard rings. In a preferred embodiment, the gates are surrounded by 12 to 18 guard rings. In one embodiment, the gates are surrounded by 14 guard rings. Similarly, the width of the trenched gates and the trenched guard rings, as well as the distances between gates and between the guard rings, are not limited to the distances shown in the figures, and are subjected to optimization for each specific application. In one embodiment, the trenched guard rings have a width in the range of 0.5-10 μm, preferably 1-6 μm. In one embodiment, the trenched guard rings have a width of 2 μm. In another embodiment, the trenched guard rings have a width of 4 μm. The spacing between two neighboring guard rings may be constant or variable, and is typically in the range of 0.5-20 μm. In one embodiment, the spacing between two neighboring guard rings are variable and are in the range of 1.5-3.5 μm.

Figure 13:
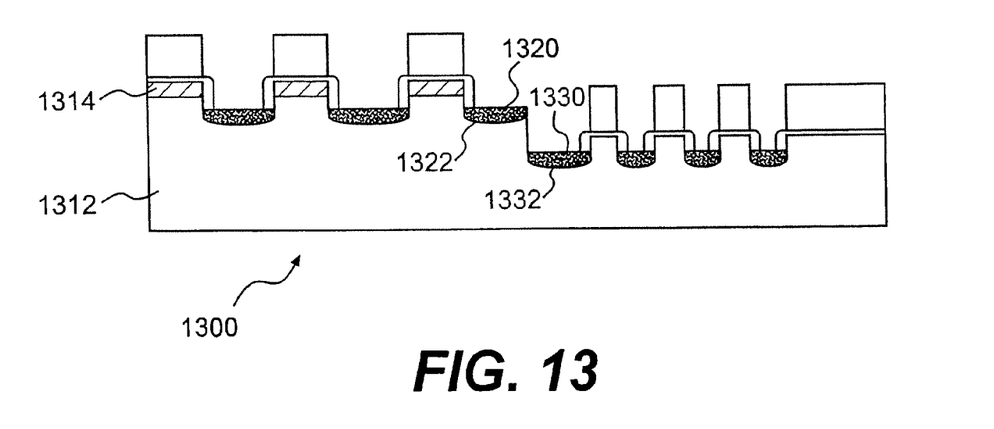
FIG. 13 is a schematic of another embodiment of a guard ring structure.

FIG. 13 illustrates another embodiment of a guard ring structure fabricated using the method described above. In this embodiment, the guard ring structure contains a semiconductor stack 1300 having a lightly doped layer 1312 and a heavily doped layer 1314. Both the gates 1320 and guard rings 1330 are formed in the lightly doped layer 1312. The bottom surfaces 1322 of the gates 1320 have a higher elevation than the bottom surfaces 1332 of the guard rings 1330. The gates 1320 and guard rings 1330 are formed simultaneously in the lightly doped layer 1312 with a single mask.

This method allows a manufacturer to precisely control the position of the first floating guard ring with respect to the main junction edge, as well as the floating guard ring widths and spacings. It also eliminates the possibility of voltage breakdown performance deterioration due to broken rings, which was a common occurrence in the prior art resist/dielectric multiple floating guard ring formation methods. Moreover, processing steps are eliminated by fabricating self-aligned floating guard rings using this method.

EXAMPLES

Example 1

Figure 14:
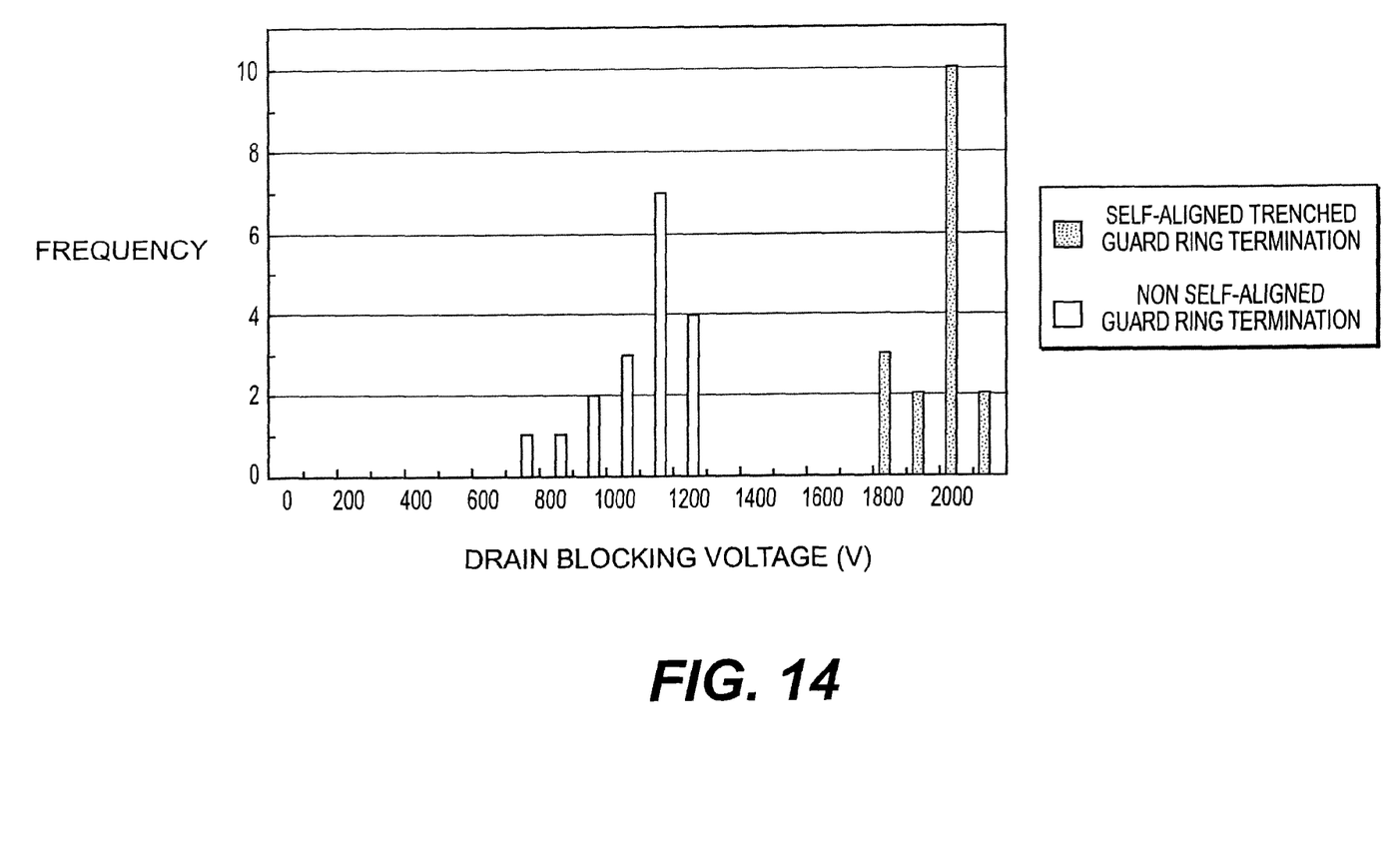
FIG. 14 is a diagram showing breakdown voltage improvement in semiconductor devices with trenched, self-aligned guard ring structure.

The Trenched, Self-Aligned Guard Ring Structure Improves Breakdown Voltage Compared to the Prior Art Method A wafer containing prototype VJFETs is manufactured using the method described above. A wafer containing VJFETs of prior art methods is also manufactured. A high voltage curve tracer is used to measure and record breakdown voltages of numerous devices across the wafers. As shown in FIG. 14, the self-aligned trenched guard ring structure (gray bars) significantly improves breakdown voltage value and breakdown voltage dispersion compared to guard rings made with the prior art method (white bars). From textbook physics calculations, the capability of a VJFET's 11.68 micron thick drift layer doped to $3.46 \times 10^{-15}$ is 2078 V, which is the maximum theoretical breakdown voltage that the device can achieve.

Example 2

Guard Ring Designs with Various Ring Widths, Ring Numbers, and Ring Spacings

Several guard ring configurations are tested for breakdown voltage. The ring widths, numbers, and spacings of each configuration are listed in Table 1.

TABLE 1

Guard Ring Configurations

| | GRD8 | | GRD1 | | GRD2 | | GRD3 | | GRD4 | | GRD5 | |
|---|---|---|---|---|---|---|---|---|---|---|---|---|
| Implant ring width (um) | 2 | | 2 | | 2 | | 2 | | 2 | | 4 | |
| No. of rings/ spacing (um) | 3 | 2 | 2 | 2 | 3 | 2 | 3 | 1.5 | 2 | 1.5 | 3 | 2 |
| | 3 | 2.5 | 2 | 2.5 | 3 | 3 | 3 | 2 | 2 | 2 | 3 | 2.5 |
| | 3 | 3 | 2 | 3 | 3 | 4 | 3 | 2.5 | 2 | 2.5 | 3 | 3 |
| | 3 | 3.5 | 2 | 3.5 | 3 | 5 | 3 | 3 | 2 | 3 | 3 | 3.5 |
| | 2 | 4 | 2 | 4 | 3 | 6 | 2 | 3.5 | 2 | 3.5 | 2 | 4 |
| | | | | | 2 | 4.5 | | | 2 | 4 | | |
| | | | | | 2 | 5 | | | 2 | 4.5 | | |

Figure 15:
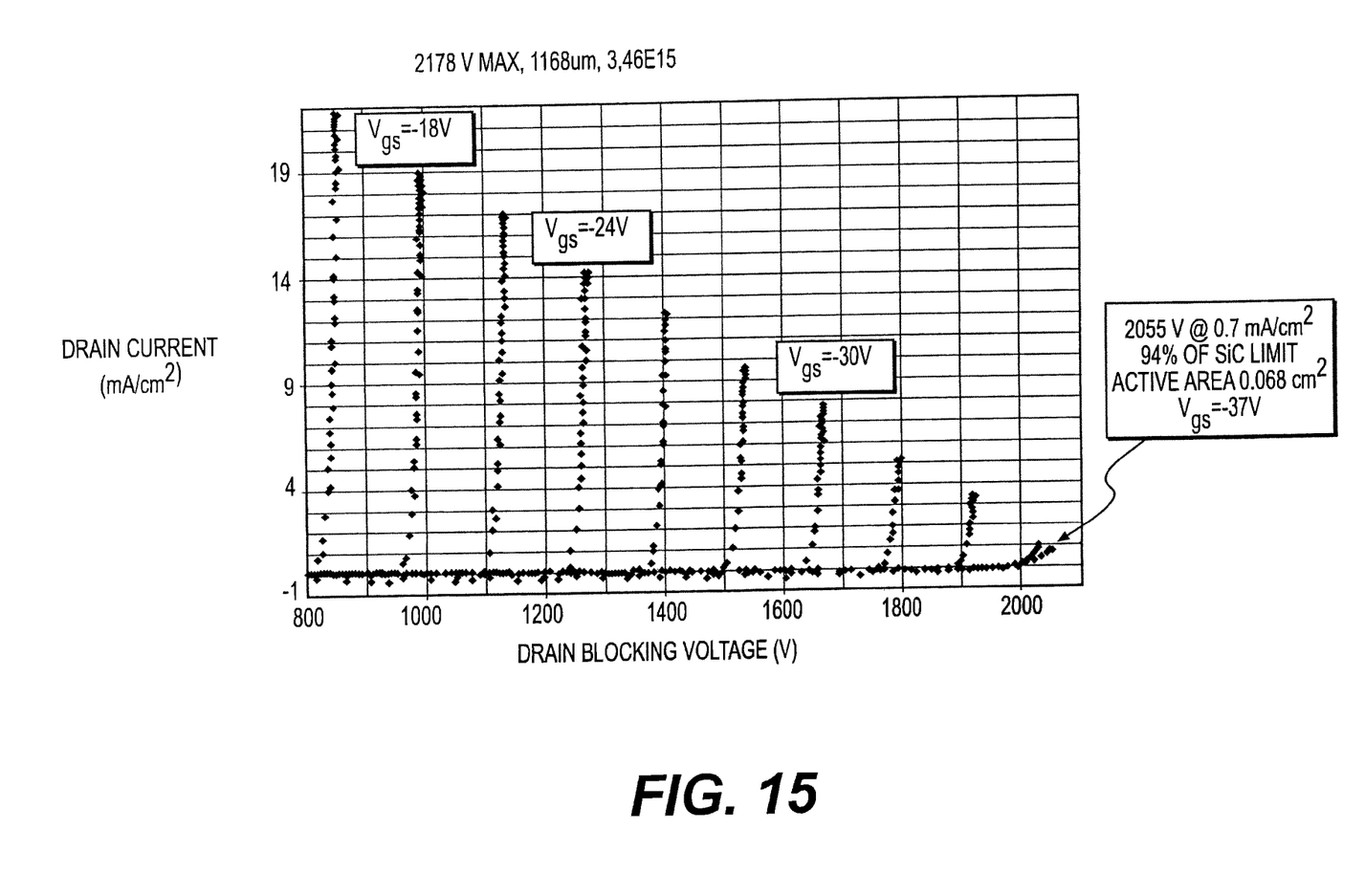
FIG. 15 is a diagram showing drain voltage blocking in semiconductor devices with trenched, self-aligned guard ring structure.

The highest breakdown voltage was obtained with the GRD 3 configuration. FIG. 15 shows the blocking voltage characteristics vs. gate voltage of a 0.068 cm² active area VJFET with GRD 3 guard ring configuration. At a gate-to-source bias of −37 V, the VJFET is capable of blocking voltage of 2055 V, which is 94% of the drift layer's theoretical breakdown voltage limit.

The foregoing discussion discloses and describes many exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A guard ring structure for use in a semiconductor device, comprising:
    a semiconductor layer stack comprising a first layer, a second layer on top of said first layer and a third layer on top of said second layer;
    gates formed in contact with only said second layer; and
    guard rings formed in contact with only said first layer,
    wherein said second layer has a dopant concentration that is higher than a dopant concentration of said first layer, wherein said third layer has a dopant concentration that is higher than the dopant concentration of said second layer, and wherein bottom surfaces of said gates have elevations higher than bottom surfaces of said guard rings.

2. The guard ring structure of claim 1, having 2-30 guard rings with a ring width in the range of 0.5-10 μm and ring spacings in the range of 0.5-20 μm.

3. The guard ring structure of claim 1, having 14 guard rings, a ring width of 2 μm or 4 μm, and ring spacings in the range of 1.5-6 μm.

4. The guard ring structure of claim 1, wherein said semiconductor layer stack comprises a semiconductor material selected from the group consisting of SiC, GaAs, GaN, $Al_x$-$GaN_{1-x}$/GaN, $In_xGa_{1-x}$N/GaN, Si, sapphire, and diamond, wherein $0 < x < 1$.

5. The guard ring structure of claim 1, wherein the outermost gate is joined to the innermost guard ring via a sloping sidewall.

6. The guard ring structure of claim 1, wherein the outermost gate is joined to the innermost guard ring via a vertical sidewall.

7. The guard ring structure of claim 1, wherein the innermost guard ring has a width that is larger than other guard rings.

8. The guard ring structure of claim 1, wherein the gates are trenched gates.

9. The guard ring structure of claim 1, wherein the guard rings are trenched guard rings.

* * * * *